(12) United States Patent
Hong

(10) Patent No.: US 8,207,562 B2
(45) Date of Patent: Jun. 26, 2012

(54) IMAGE SENSOR AND METHOD OF FABRICATING THE SAME INCLUDING A GATE INSULATION LAYER, A GATE ELECTRODE, A PHOTODIODE AND A FLOATING DIFFUSION REGION

(75) Inventor: Ji-Hoon Hong, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 274 days.

(21) Appl. No.: 12/581,407

(22) Filed: Oct. 19, 2009

(65) Prior Publication Data

US 2010/0038690 A1  Feb. 18, 2010

(30) Foreign Application Priority Data

Dec. 27, 2006  (KR) .................. 10-2006-0135632

(51) Int. Cl.
*H01L 31/062* (2006.01)
*H01L 31/113* (2006.01)
*H01L 31/06* (2006.01)
*H01L 31/00* (2006.01)

(52) U.S. Cl. ........ 257/292; 257/461; 257/462; 257/466; 257/E27.133; 257/E31.053

(58) Field of Classification Search .................. 257/292, 257/461, 462, 466, E27.133, E31.053
See application file for complete search history.

(56) References Cited

U.S. PATENT DOCUMENTS

| | | | |
|---|---|---|---|
| 6,600,512 B1 * | 7/2003 | Kimura | 348/283 |
| 7,026,202 B2 * | 4/2006 | Mandelman et al. | 438/182 |
| 7,091,531 B2 | 8/2006 | Boemler | |
| 7,176,518 B2 * | 2/2007 | Jung | 257/315 |
| 7,180,151 B2 * | 2/2007 | Park | 257/462 |
| 7,323,378 B2 * | 1/2008 | Chen et al. | 438/199 |
| 7,344,937 B2 * | 3/2008 | Hong | 438/211 |
| 7,364,960 B2 * | 4/2008 | Lyu | 438/204 |
| 7,402,450 B2 * | 7/2008 | Ezaki et al. | 438/57 |
| 7,405,437 B2 * | 7/2008 | Shim et al. | 257/292 |
| 7,560,754 B2 * | 7/2009 | Abe et al. | 257/222 |
| 7,608,872 B2 * | 10/2009 | Kim | 257/291 |
| 7,675,097 B2 * | 3/2010 | Adkisson et al. | 257/292 |
| 7,728,330 B2 * | 6/2010 | Li | 257/59 |
| 7,898,584 B2 * | 3/2011 | Lyu et al. | 348/294 |
| 2002/0109164 A1 * | 8/2002 | Rhodes | 257/291 |
| 2004/0217394 A1 * | 11/2004 | Lee | 257/291 |
| 2006/0240601 A1 * | 10/2006 | Nagaraja | 438/124 |
| 2006/0270096 A1 * | 11/2006 | Brady et al. | 438/73 |
| 2007/0018211 A1 * | 1/2007 | Rhodes | 257/291 |
| 2007/0034965 A1 * | 2/2007 | Jung et al. | 257/369 |
| 2007/0069259 A1 * | 3/2007 | Jeon | 257/291 |
| 2007/0161142 A1 * | 7/2007 | Mouli et al. | 438/57 |

* cited by examiner

*Primary Examiner* — Ida M Soward

(74) *Attorney, Agent, or Firm* — Sherr & Vaughn, PLLC

(57) ABSTRACT

An image sensor can include a gate insulation layer, a gate electrode, a photodiode, and a floating diffusion region. The gate insulation layer can be formed on and/or over a semiconductor substrate for a transfer transistor. The gate insulation layer includes a first gate insulation layer having a central opening and a second gate insulation layer formed on and/or over an uppermost surface of the first gate insulation layer including the opening. The gate electrode can be formed on and/or over the gate insulation layer. The photodiode can be formed in the semiconductor substrate at one side of the gate electrode so as to generate an optical charge. The floating diffusion region can be formed in the semiconductor at the other side of the gate electrode opposite to the photodiode. The floating diffusion region can be electrically connected to the photodiode through a channel so as to store the optical charge generated from the photodiode.

5 Claims, 3 Drawing Sheets

Figure 1:
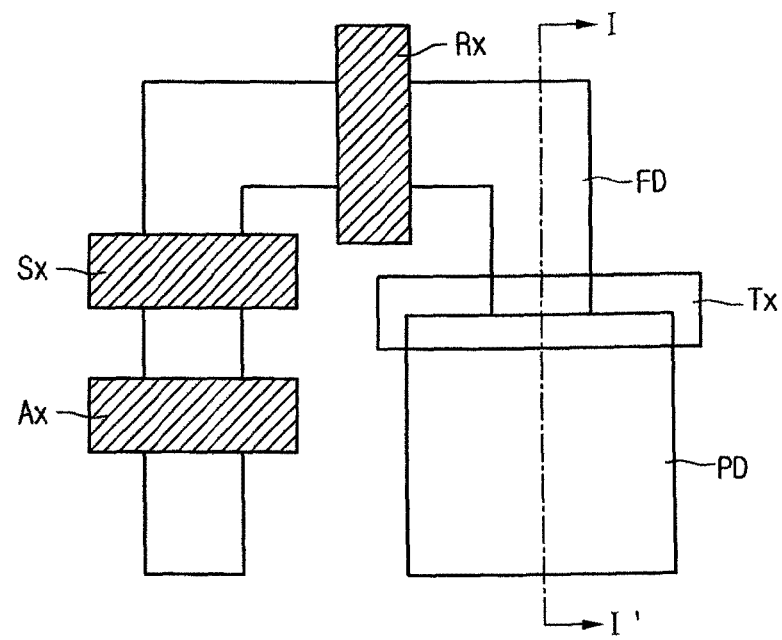

IMAGE SENSOR AND METHOD OF FABRICATING THE SAME INCLUDING A GATE INSULATION LAYER, A GATE ELECTRODE, A PHOTODIODE AND A FLOATING DIFFUSION REGION

The present application claims, under 35 U.S.C. 120, the benefit of co-pending U.S. patent application Ser. No. 11/957,200 (filed on Dec. 14, 2007), which claims priority under 35 U.S.C. 119 and 35 U.S.C. 365 to Korean Patent Application No. 10-2006-0135632 (filed on Dec. 27, 2006), which are hereby incorporated by reference in their entirety.

BACKGROUND

Image sensors are semiconductor devices for converting an optical image into an electric signal. Charge coupled devices (CCDs) and complementary metal oxide semiconductor (CMOS) image sensors are the most representative devices of the image sensors.

In a CCD, metal oxide silicon (MOS) capacitors are arranged in close proximity to each other, and charge carriers are stored in the MOS capacitors and transferred between the MOS capacitors.

A CMOS image sensor may include a plurality of MOS transistors which correspond to a plurality of pixels. The MOS transistors may be formed based on CMOS technology using a control circuit and a signal processing circuit which may be used as peripheral circuits. The CMOS image sensor may serve as a switching device for sequentially detecting outputs using the MOS transistors.

A photodiode and a plurality of MOS transistors may be included in each pixel of the CMOS image sensor. The photodiode may serve to generate an optical charge in response to incident light.

The plurality of MOS transistors may include a transfer transistor, a reset transistor, an access transistor, and a select transistor. The transfer transistor may be connected to the photodiode to transfer optical charge from the photodiode to a floating diffusion region. The reset transistor may be used to set the electric potential of the floating diffusion region to a desired value and reset the floating diffusion region by discharging the floating diffusion region. A voltage of the floating diffusion region may be applied to a gate of the access transistor such that the access transistor is used as a source follower buffer amplifier. The select transistor may be used for addressing by using a switching function.

The transfer transistor may include a gate, a channel through which charge carriers moves, and a drain (hereinafter, referred to as a floating diffusion region) used as a floating diffusion region. The gate may be formed between device isolation pattern lines that define an active region and a field region on and/or over a semiconductor substrate. The gate may include a gate insulation layer and a polysilicon layer.

The channel may be used to control a threshold voltage and transfer an optical charge from the photodiode to the floating diffusion region. The channel may be formed in the semiconductor substrate in correspondence with the gate. The channel may be formed by implanting ions into the semiconductor substrate.

The photodiode and the floating diffusion region may be formed at both sides of the channel. The floating diffusion region stores a charge transferred from the photodiode through the channel.

The operation of the transfer transistor will now be briefly described. First, the photodiode generates an optical charge in response to incident light, and then, the gate of the transfer transistor is turned on. As a result, a threshold voltage controlled by the channel is reduced, and thus, the optical charge can be transferred from the photodiode to the floating diffusion region through the channel.

However, in such a CMOS image sensor, the characteristics of the transfer transistor may be deteriorated due to structural defects. In this case, when the gate is turned off, a leakage current can be generated. Furthermore, when the gate is turned on, the optical charge cannot be completely transferred from the photodiode to the floating diffusion region, thereby resulting in a decrease in saturation level and image quality.

This problem may be due to the thickness of a gate insulation layer of the transfer transistor. For example, the thickness of the gate insulation can be increased to increase a threshold voltage so as to prevent the optical charge generated in the photodiode from leaking through the channel. However, in this case, when the gate is turned on, the optical charge cannot be completely transferred from the photodiode to the floating diffusion region as described above.

On the other hand, the thickness of the gate insulation layer can be decreased to decrease the threshold voltage so as to completely transfer the optical charge from the photodiode to the floating diffusion region when the gate is turned on. However, in this case, the optical charge can leak from the photodiode through the channel.

SUMMARY

Embodiments relate to an image sensor and a method of fabricating the same that can serve to reduce current leakage.

Embodiments relate to an image sensor that can include: a gate insulation layer formed over a semiconductor substrate for a transfer transistor, the gate insulation layer including a first gate insulation layer having a central opening and a second gate insulation layer formed over the first gate insulation layer including the opening; a gate electrode formed over the gate insulation layer; a photodiode formed in the semiconductor substrate at one side of the gate electrode; and a floating diffusion region formed in the semiconductor at another side of the gate electrode opposite to the photodiode, the floating diffusion region being electrically connected to the photodiode through a channel.

Embodiments relate to a method of fabricating an image sensor that can include at least one of the following steps: depositing a first gate insulation material over a semiconductor substrate; forming a first gate insulation layer having an opening at a center portion thereof by patterning the first gate insulation material; sequentially depositing a second gate insulation material and a gate electrode material over the semiconductor substrate including the first gate insulation layer; sequentially forming a second gate insulation layer and a gate electrode by patterning the second gate insulation material and the gate electrode material; forming a photodiode in the semiconductor substrate at one side of the gate electrode by implanting a plurality of ions in the semiconductor substrate; and then forming a floating diffusion region in the semiconductor substrate at another side of the gate electrode opposite to the photodiode by implanting ions into the semiconductor substrate.

Embodiments relate to a method of fabricating an image sensor that can include at least one of the following steps: forming a first gate insulation layer having an opening at a center portion thereof over a semiconductor substrate; sequentially forming a second gate insulation layer and a gate electrode over the semiconductor substrate including the first gate insulation layer; forming a photodiode in the semiconductor substrate laterally adjacent to one side of the gate electrode; forming a floating diffusion region in the semiconductor substrate laterally adjacent to another side of the gate electrode opposite to the photodiode; and then forming a channel in the semiconductor substrate to electrically connect the floating diffusion region to the photodiode.

DRAWINGS

Example FIGS. 1 to 6 illustrate an image sensor, in accordance with embodiments.

DESCRIPTION

Figure 2:
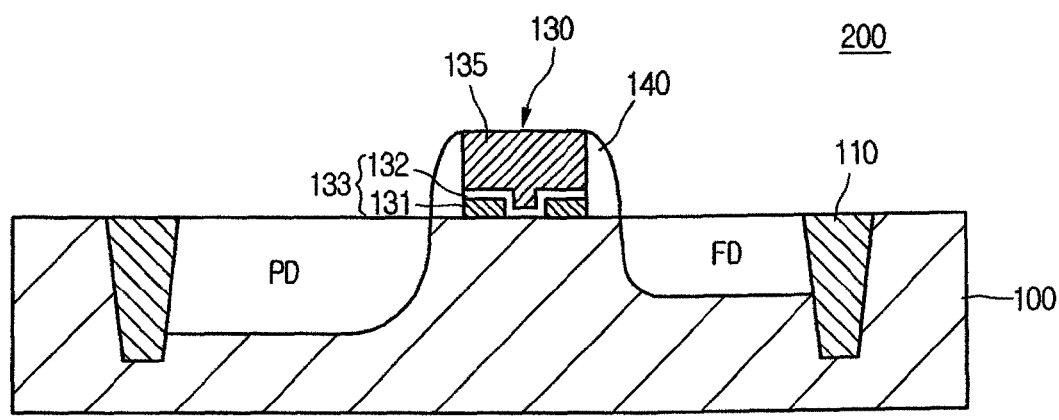

As illustrated in example FIGS. 1 and 2, each pixel of image sensor 200 can include photodiode PD that can serve to generate an optical charge in response to light. Transfer transistor Tx can be connected to photodiode PD to transfer the optical charge from photodiode PD to a floating diffusion region. Reset transistor Rx can serve to set the electric potential of the floating diffusion region to a desired value and reset the floating diffusion region by discharging the floating diffusion region. Select transistor Sx can be used for purposes of addressing by using a switching function. A voltage of the floating diffusion region can be applied to a gate of access transistor Ax such that access transistor Ax is used as a source follower buffer amplifier.

Transfer transistor Tx and reset transistor Rx can be connected to photodiode PD in series. A source of transfer transistor Tx can be connected to photodiode PD, and a drain of transfer transistor Tx can be connected to a source of reset transistor Rx. Power voltage Vdd can be applied to a drain of reset transistor Rx.

The drain of transfer transistor Tx can be used as floating diffusion region FD. Floating diffusion region FD can be connected to a gate of select transistor Sx. Select transistor Sx and access transistor Ax can be connected to each other in series. Particularly, a source of select transistor Sx can be connected to a drain of access transistor Ax.

Power voltage Vdd can also be applied to the source of select transistor Sx and the drain of access transistor Ax. A drain of select transistor Sx can be used as an output stage, and a select signal can be applied to the gate of select transistor Sx.

As illustrated in example FIG. 2, photodiode PD and transfer transistor Tx of the pixel of image sensor 200 are described in greater detail. A pair of trenches can be formed in semiconductor substrate 100 to form device isolation patterns 110 that define an active region and a field region in semiconductor substrate 100.

Transfer gate 130 of transfer transistor Tx can be formed in the middle of the regions defined by device isolation pattern 110. Transfer gate 130 can include gate insulation layer 133 and gate electrode 135 formed on and/or over gate insulating layer 133.

Gate insulation layer 133 can be formed as a multilayer structure including first gate insulation layer 131 formed on and/or over semiconductor substrate 100 and second gate insulation layer 132 formed on and/or over first gate insulating layer 131. First gate insulation layer 131 can include a central opening and second gate insulation layer 132 can be formed on and/or over first gate insulation layer 131 to cover first gate insulation layer 131 and the central opening.

The thickness of first gate insulation layer 131 measured from an uppermost surface to a bottommost surface thereof can be greater than the thickness of second gate insulation layer 132 measured from an uppermost surface to a bottommost surface thereof. In accordance with embodiments, the thickness of first gate insulation layer 131 can be 28 Å while the thickness of second gate insulation layer 132 can be 20 Å.

Since the gate insulation layer 133 can be formed into a two-layer structure, gate insulation layer 133 can function as a good barrier for preventing a leakage current when transfer gate 130 is turned off.

The thickness of gate insulation layer 133 can be relatively small at its center portion due to the central opening formed in first gate insulation layer 131. Therefore, when transfer gate 130 of transfer transistor Tx is turned on, a threshold voltage can be reduced as a result of the relatively thin center portion of gate insulation layer 133.

A pair of gate spacers 140 can be formed on both sides and in direct contact with transfer gate 130. Gate spacers 140 can be formed on and/or over an uppermost surface of semiconductor substrate 100 to an uppermost surface of gate electrode 135 to cover lateral sides of transfer gate 130.

Photodiode PD and floating diffusion region FD can be formed in semiconductor substrate 100 at both sides of transfer gate 130, respectively. Photodiode PD and floating diffusion region FD can be formed by implanting ions into semiconductor substrate 100. Photodiode PD can be formed laterally between transfer gate 130 and device isolation pattern 110. Photodiode PD can have a depth greater than that of floating diffusion region FD. Particularly, photodiode PD can be formed in semiconductor substrate 100 a spatial distance beginning at gate spacer 140 to one of device isolation patterns 110.

Floating diffusion region FD can be formed on an opposite side of photodiode PD laterally between transfer gate 130 and the other device isolation pattern 110. Particularly, floating diffusion region FD can be formed in semiconductor substrate 100 a distance beginning at gate spacer 140 to the other one of device isolation patterns 110.

A channel can be formed between photodiode PD and floating diffusion region FD for controlling a threshold voltage and transferring an optical charge generated from photodiode PD to floating diffusion region FD.

Figure 3:
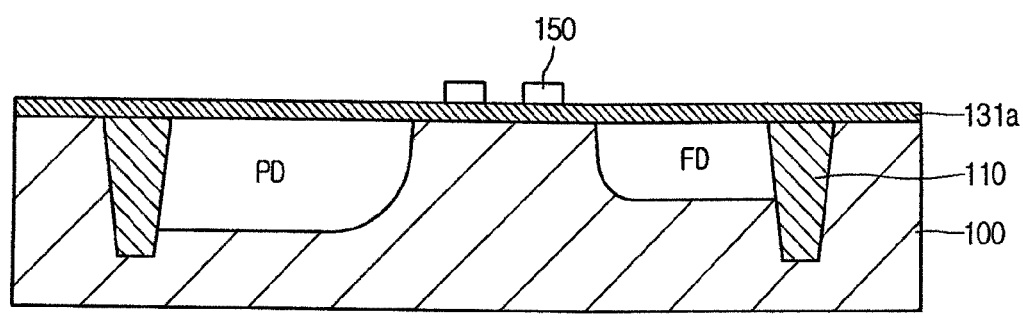
Figure 4:
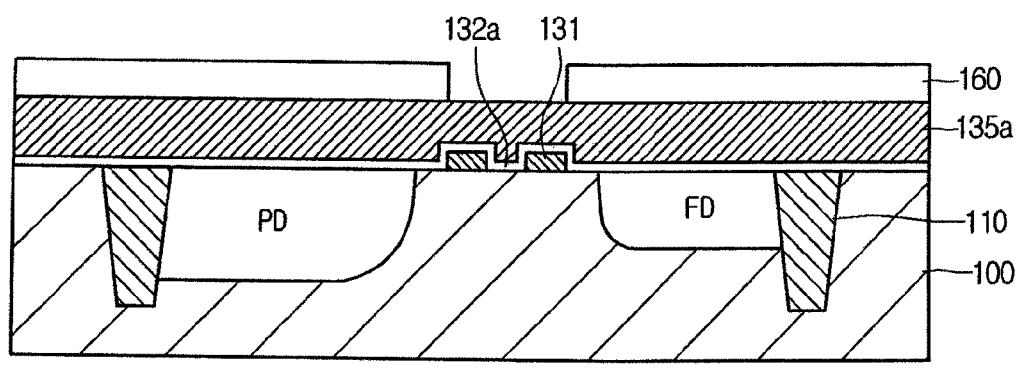

As illustrated in example FIGS. 3 and 4, formation of a first gate insulation layer on and/or over a semiconductor substrate and a second gate insulation layer and a gate electrode in accordance with embodiments.

As illustrated in example FIG. 3, a pair of device isolation patterns 110 can be formed in p-type semiconductor substrate 100 to define an active region and a field region. Semiconductor substrate 100 can have a stacked structure including a high-concentration p-type substrate and a low-concentration p-type epitaxial layer formed on and/or over the p-type substrate. Device isolation patterns 110 can be formed by forming trenches in semiconductor substrate 100 and filling the trenches with an oxide material.

A plurality of ions can then be implanted into semiconductor substrate 100 for adjusting a threshold voltage and transferring charge carriers. Next, first gate insulation material 131a can be deposited on and/or over the entire uppermost surface of semiconductor substrate 100 including device isolation patterns 110. In accordance with embodiments, first gate insulation material 131a can be composed of an oxide. Photoresist film can then be formed on and/or over first gate insulation material 131a. The photoresist film can then be patterned to form photoresist pattern 150.

As illustrated in example FIG. 4, first gate insulation material 131a can then be patterned using photoresist pattern 150 as an etching mask to form first gate insulation layer 131 in the middle of the regions defined by device isolation pattern 110. First gate insulation layer 131 can include an opening in a center portion thereof. In accordance with embodiments, the thickness of first gate insulation layer 131 measured from an uppermost surface to a bottommost surface thereof can be 28 Å.

Second gate insulation material 132a and gate electrode material 135a can then be sequentially deposited on and/or over the entire uppermost surface of semiconductor substrate 100 including first gate insulation layer 131. In accordance with embodiments, second gate insulation material 132a can be composed of an oxide and gate electrode material 135a can be composed of polysilicon. Next, a photoresist film can be formed on and/or over gate electrode material 135a. The photoresist film can then be patterned to form a pair of photoresist patterns 160.

Figure 5:
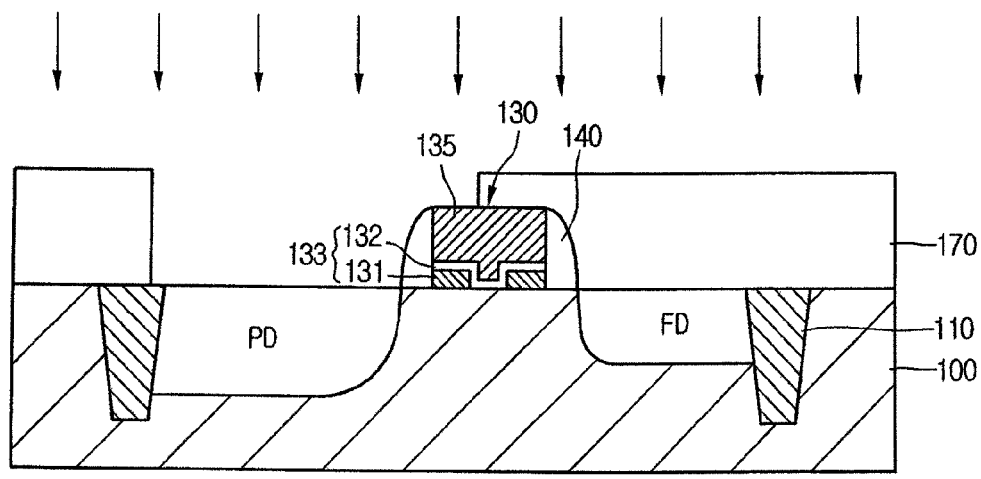

As illustrated in example FIG. 5, gate electrode material 135a and second gate insulation material 132a can then be sequentially patterned using photoresist patterns 160 as an etch mask to form second gate insulation layer 132 on and/or over first gate insulation layer 131 and gate electrode 135 on and/or over second gate insulation layer 132. In accordance with embodiments, the thickness of second gate insulation layer 132 measured from an uppermost surface to a bottommost surface thereof can be smaller than that of first gate insulation layer 131. The thickness of second gate insulation layer 132 can be 20 Å.

Accordingly, first gate insulation layer 131, second gate insulation layer 132, and gate electrode 135 combine to form transfer gate 130. A pair of gate spacers 140 can then be formed on both sides of transfer gate 130.

Next, first ion implantation mask 170 that can be used for ion implantation can be formed to cover semiconductor substrate 100 except for a region of semiconductor substrate 100 where photodiode PD will be formed. Using first ion implantation mask 170, a plurality of ions can then be implanted into the region of semiconductor substrate 100 to form photodiode PD. Photodiode PD can be formed a spatial distance laterally from one side of transfer gate 130 to device isolation pattern 110.

Figure 6:
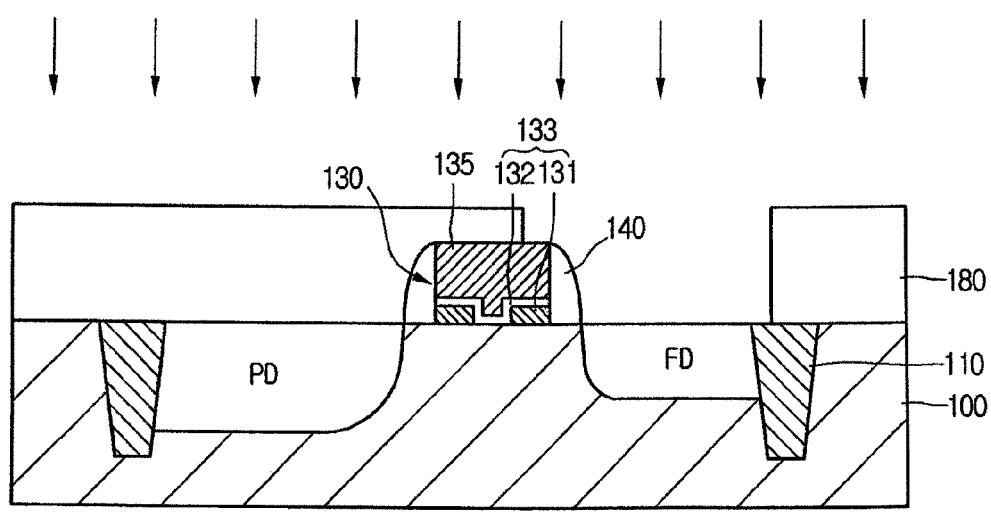

As illustrated in example FIG. 6, second ion implantation mask 180 can then be formed to cover semiconductor substrate 100 except for a portion of the semiconductor substrate 100 where a drain (i.e., floating diffusion region FD) of a transfer transistor will be formed. Ion implantation is performed using the ion implantation mask 180. Then, floating diffusion region FD of transfer transistor Tx is formed a spatial distance laterally from device isolation pattern 110 from spacer 140 to the other side of transfer gate 130 opposite to photodiode PD.

A channel can be formed between floating diffusion region FD and photodiode PD as a connection path.

In accordance with embodiments, since gate insulation layer 133 has a two-layer structure, gate insulation layer 133 can function as a good barrier for preventing a leakage current when transfer gate 130 of transfer transistor Tx is turned off. Furthermore, the thickness of gate insulation layer 133 can be relatively small at its center portion due to the central opening formed in first gate insulation layer 131. Therefore, when transfer gate 130 of transfer transistor Tx is turned on, a threshold voltage can be reduced due to the relatively thin center portion of gate insulation layer 133. Consequently, an optical charge generated from photodiode PD can be smoothly transferred to floating diffusion region FD through the channel. As a result, the image sensor can provide high-quality images.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
    a gate insulation layer formed over a semiconductor substrate for a transfer transistor, the gate insulation layer including a first gate insulation layer having a central opening and a second gate insulation layer formed over the first gate insulation layer including the opening;
    a gate electrode formed over the gate insulation layer;
    a photodiode formed in the semiconductor substrate at one side of the gate electrode; and
    a floating diffusion region formed in the semiconductor at another side of the gate electrode opposite to the photodiode, the floating diffusion region being electrically connected to the photodiode through a channel,
    wherein the second gate insulation layer is in direct contact with an upper surface of the first gate insulation layer.

2. The apparatus of claim 1, wherein a thickness of the first gate insulation layer is greater than a thickness of the second, gate insulation layer.

3. The apparatus of claim 2, wherein the thickness of the first gate insulation layer is 28 Å.

4. The apparatus of claim 3, wherein the thickness of the second gate insulation layer is 20 Å.

5. The apparatus of claim 1, wherein a lowermost portion of the gate electrode is disposed in the central opening.

* * * * *